United States Patent [19]

Filippazzi et al.

[11] 3,787,252

[45] Jan. 22, 1974

[54] CONNECTION MEANS FOR SEMICONDUCTOR COMPONENTS AND INTEGRATED CIRCUITS

[75] Inventors: Franco Filippazzi, Milano; Franco Forlani, Rho, both of Italy

[73] Assignee: Honeywell Information Systems Italia S.p.A., Milan, Italy

[22] Filed: Nov. 8, 1971

[21] Appl. No.: 196,380

Related U.S. Application Data

[63] Continuation of Ser. No. 838,221, July 1, 1969, abandoned.

[30] Foreign Application Priority Data

July 5, 1968 Italy ........................ 18595A/68

[52] U.S. Cl. .................. 148/175, 29/580, 29/589, 29/591, 148/174, 317/101, 317/235 R

[51] Int. Cl. ......... H01l 19/00, H01l 7/36, H01l 5/00

[58] Field of Search ..... 148/1.5, 174, 175; 317/234, 317/235, 101; 29/580, 589, 591

[56] References Cited

UNITED STATES PATENTS

| | | | |
|---|---|---|---|
| 3,343,256 | 9/1967 | Smith et al. | 29/578 |
| 3,372,070 | 3/1968 | Zuk | 317/235 E |
| 3,427,709 | 2/1969 | Schutze et al. | 29/580 |
| 3,440,498 | 4/1969 | Mitchell | 317/234 |
| 3,456,335 | 7/1969 | Hennings et al. | 317/101 X |
| 3,462,650 | 8/1969 | Hennings et al. | 317/101 |
| 3,471,922 | 10/1969 | Legat et al. | 29/580 |

OTHER PUBLICATIONS

May, G. A., "Schottky–Barrier Collector Transistor" Solid–State Electronics, Vol. 11, 1968, pp. 613–619.

*Primary Examiner*—L. Dewayne Rutledge
*Assistant Examiner*—W. G. Saba
*Attorney, Agent, or Firm*—George V. Eltgroth et al.

[57] ABSTRACT

In a semiconductor wafer having an epitaxial layer on which circuit elements are formed, through-connections for said circuit elements to contacts formed on the opposite surface of the layer are provided by tapered high conductivity semiconductor regions insulated from the body by a thin layer of dielectric material and in contact with suitably doped portions of the epitaxial layer to provide insulation by means of reversely biased junctions.

3 Claims, 10 Drawing Figures

INVENTORS
Franco FILIPPAZZI
Franco FORLANI

BY ATTORNEY George V. Eltgroth and Joseph B. Forman

INVENTORS
Franco FILIPPAZZI
Franco FORLANI

BY George V. Eltgroth and Joseph B. Forman ATTORNEY

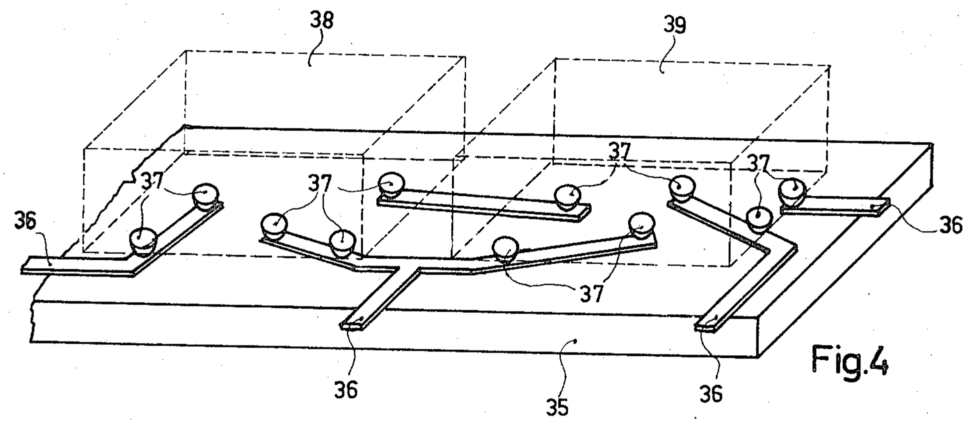
Fig.4
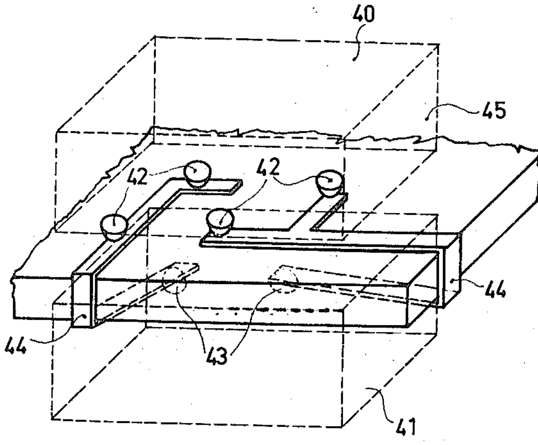
Fig.5
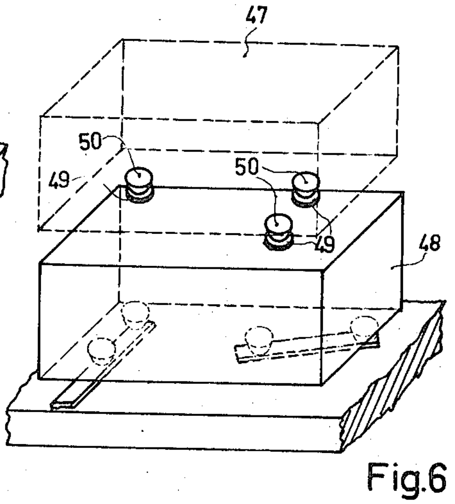
Fig.6
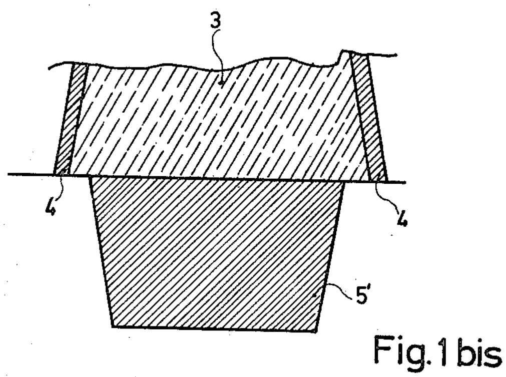
Fig.1 bis
INVENTORS
Franco FILIPPAZZI
Franco FORLANI
George V. Eltgroth
BY Joseph B Forman ATTORNEY INVENTORS
Franco FILIPPAZZI
Franco FORLANI
BY George V. Eltgroth and Joseph B. Forman ATTORNEY

CONNECTION MEANS FOR SEMICONDUCTOR COMPONENTS AND INTEGRATED CIRCUITS

This is a continuation of application Ser. No. 838,221, filed July 1, 1969, and now abandoned.

The invention relates to means for connecting semiconductor circuit components and integrated circuits, as those used for example in electronic apparatus for data processing.

The problem of connecting semiconductor circuit components and integrated circuits may be viewed from three different points of view. In the case of hybrid circuits a number of circuit components, for example diodes and transistors, which are separately fabricated on semiconductor wafers, must be connected to a network of conductors deposited on insulating boards. In the case of integrated circuits, wherein a plurality of circuit elements are fabricated on a major surface of a semiconductor wafer, they may fall in either one of two different types.

In the first type, called hybrid integrated circuits, circuit sub-units, each one of them fabricated on a major surface of a single semiconductor wafer and containing a relatively small number of circuit elements, are interconnected with the external circuit through connections deposited on an insulating board, in order to form a complete functional unit which is enclosed in a single container. This technique is also known as Medium Scale Integration (M.S.I.). The second type is called Large Scale Integration (L.S.I.), wherein a complete functional unit, comprising a substantially large number of circuit elements, is fabricated on a major surface of a single semiconductor wafer.

Substantial difficulties, increasing with the degree of miniaturization and the complexity of the circuits, are encountered in all these cases for establishing connection means. These difficulties are mainly caused by the fact that, in the prior art technique, the connection means comprise connecting contacts and conductors located exclusively on the same face of the conductor wafer on which the circuit elements are fabricated.

For purposes of reliability, the contacts for external connections cannot have very small dimensions, and therefore a substantial part of the useful surface is occupied by these contacts. In addition, in the case of integrated circuits, a number of circuit elements must be connected together and to the external circuits. This results in multiple cross-overs and superpositions of the connecting conductors which therefore must be mutually insulated by the interposition of dielectric layers. This causes an increase of fabrication costs, a reduction of the density of circuit elements which can be located on a single semiconductor wafer and a decrease in the production yield and in the reliability of the integrated circuit.

In a copending application Ser. No. 732,988 filed in the U.S. Patent Office by Franco Forlani, Nicola Minnaja and Giorgio Sacchi, for Integrated Assembly of Solid State Circuital Elements, on May 29, 1968, a method is described for obtaining the connection means of a particular integrated circuit, a diode matrix, by means of connecting conductors located on the side opposite to that used for fabricating the circuit elements, these connecting conductors being in electrical connection with the circuit elements through high conductivity regions of the semiconductor wafer which are insulated from one another by physical separation obtained by chemical etching.

A method for forming connections between opposite faces of the wafer is known, such method providing openings through the wafer, whose walls are doped and polarized to provide insulating junctions. However these connections have high resistivity and high capacity.

It is an object of the present invention to extend the disposition shown in the said copending application to the case of separated semiconductor components and to any sort of integrated circuits, in order to obviate the aforesaid inconvenients.

A specific object of the invention is facilitating the construction of hybrid circuits, by providing external connecting means of comparatively large dimensions for the single circuit elements, while reducing the area occupied by said contacts on the fabricated surface of the wafer, and at the same time allowing the efficiency of the established external connections to be easily checked.

Another object of the invention is to provide means for the connection of integrated circuit sub-units in hybrid integrated circuits.

Another object of the invention is to allow a greater variety of spatial relationships of said circuit sub-units when assembled to form a single integrated circuit, by permitting such circuit sub-units to be juxtaposed or superimposed in different ways.

A further object of the invention is to facilitate the fabrication and connection of medium and large scale integrated circuits by providing connection means which reduce the surface occupied on the fabricated side of the semiconductor wafer and the number of crossovers and superimpositions between conductors.

These objects are obtained by providing on a single monocrystalline semiconductor wafer, on the upper surface of which the circuit elements are fabricated, tapered regions, filled by low resistivity materials, passing through the entire thickness of the wafer, and insulated from the same.

These regions have a substantially frustoconical or frustopyramidal shape, their minor bases being on the upper surface of the wafer and occupying therein areas of reduced dimensions which can be connected with the circuit elements formed on said upper surface, whereas the major bases, having a relatively extended surface, are on the lower side of the wafer in ohmic contact with metallic connection elements.

These regions are insulated from the rest of the wafer by convenient means which may comprise interposed dielectric layers, and conveniently polarized semiconductor junctions.

These and other advantages and features of the present invention will appear from the detailed description of a preferred embodiment thereof and from the accompanying drawings, wherein:

FIG. 1 shows, in section, a portion of a semiconductor wafer and one of the connection means according to a preferred embodiment.

FIG. 1 *bis* shows a variant in the form of the connecting contact.

FIGS. 4, 5 and 6 show different forms of interconnection of integrated circuit sub-units.

Figure 1:
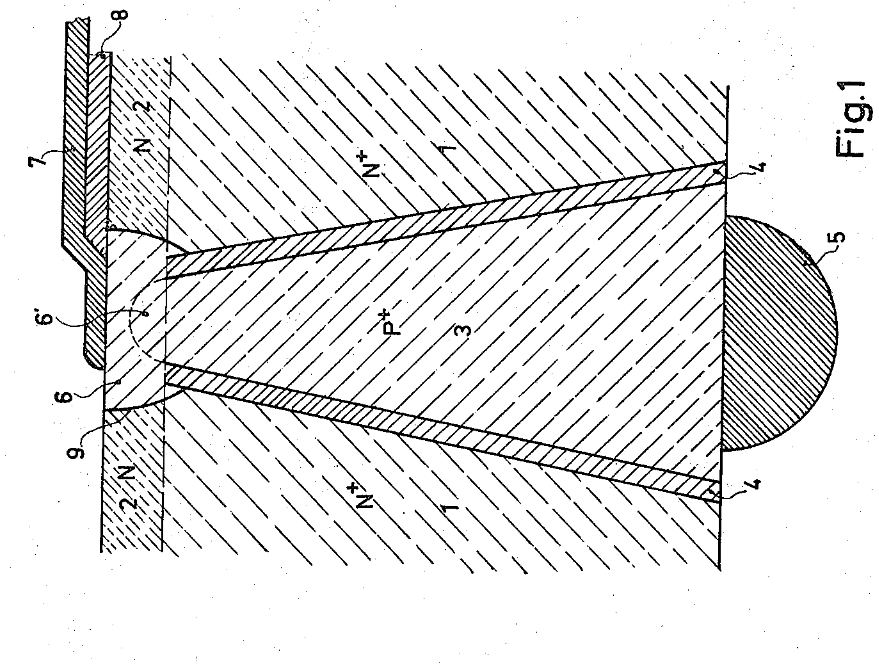

FIG. 1 shows, in section, a portion of a monocrystalline semiconductor wafer used as a support for a circuit component or an integrated circuit. According to a generally adopted disposition, the wafer comprises a semiconductor body having a relatively large thickness, for example, 100 microns, suitably doped, to obtain a relatively elevated N-type conductivity (corresponding for example to a resistivity of 0.01 Ohm./cm).

On the upper surface of said body a relatively thin layer 2 is epitaxially grown. This thin layer may have for example a thickness of 5 microns and is of semiconductor material having a conductivity of the same N type as the body, but substantially lower, for example corresponding to a resistivity of 1.5 Ohm./cm. The N-type, relatively high, conductivity of the body is indicated in the following text and in the drawings by $N^+$, whereas the reduced conductivity of type N of the thin layer is indicated by N: by analogy, the P-type high and low conductivities are respectively indicated by $P^+$ and P.

The body 1 is traversed, through its whole thickness, by a region 3, having a tapered, that is, approximately frustoconical or frustopyramidal, shape, of polycrystalline semiconductor, having a relatively high conductivity of type $P^+$, separated from the body 1 by a suitable layer of dielectric material, for example, silicon dioxide. The region 3 terminates at the lower surface of the body 1, and on its major base an approximately hemispherical portion of metallic material 5, for example gold, is deposited, thereby forming an ohmic contact with said region 3, and providing a connecting contact to an external circuit.

As indicated in FIG. 1 *bis*, this connecting contact may have a different shape, for example that of a tapered cylinder.

On the upper side, the region 3 terminates in correspondence with the surface of separation between the body 1 and the epitaxially grown thin layer 2. The dielectric layer 4, interposed between region 3 and layer 1, also terminates in correspondence with this surface. Above and in contact with the upper minor surface of the region 3, the epitaxial layer 2 shows a limited region 6 of $P^+$ type conductivity, obtained by suitably diffusing a selected impurity in the layer 2. This region 6, being epitaxially grown, presents, in contact with the minor base of region 3, a polycrystalline portion 6' while the remaining portion of region 6 is monocrystalline. The width of the diffused region 6 is such, that the boundary surface between region 6 and the surrounding layer 2 is contained in the monocrystalline portion of region 6. The boundary surface 9 is therefore a junction between regions of opposite doping ($P^+$ and N), and, when suitably biased, forms an insulating zone between region 6 and layer 2.

The polycrystalline region 3, and the diffused region 6, both of $P^+$-type conductivity, thereby form a conducting region, insulated from the body 1, providing a low resistance path between the connection contact 5 and the upper surface of region 3, which is level with the upper surface of the semiconductor wafer. On this surface a strip 7 of conducting material, for example aluminum, may be deposited by known means, this strip being in ohmic contact with region 6 and insulated from the surface of the layer 2 by a dielectric layer 8. Thus, a low resistance electrical connection is provided between contact 5 on the lower surface of the wafer and one or more points suitably chosen on the upper surface, on which the semiconductor components are fabricated. The capacity of such connection is easily limited by choosing a suitable thickness of the insulating layer.

Figure 2:
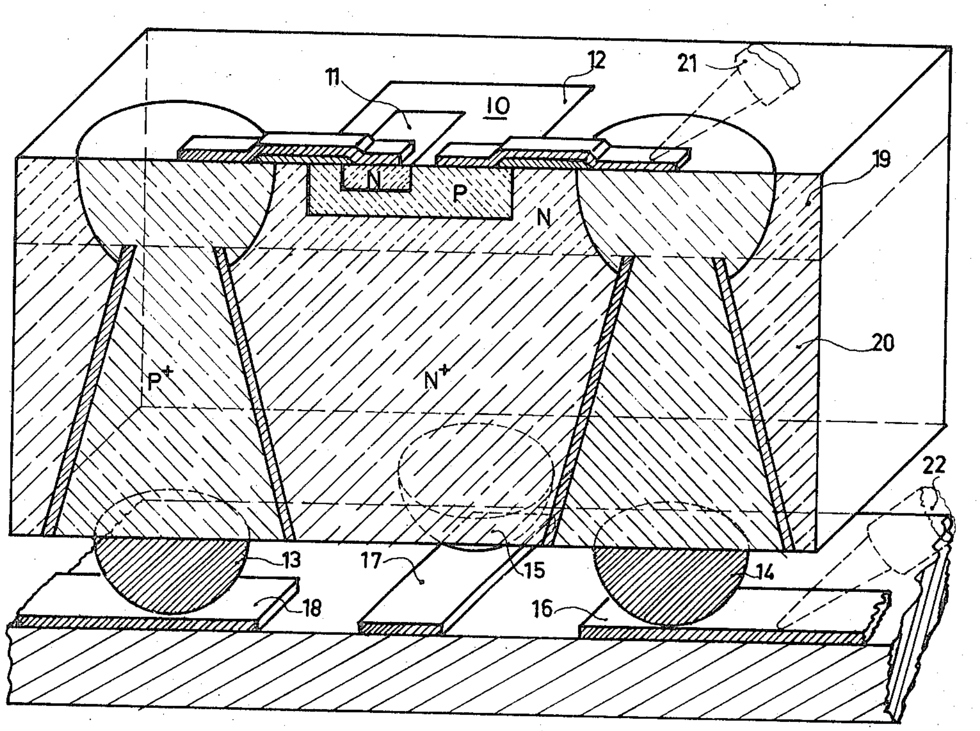
FIG. 2 shows, in schematic prospective and section, a single circuit element and the related connection means.

FIG. 2 represents, in section and perspective, a transistor 10 of type PNP, fabricated on a semiconductor wafer. Emitter 11 and base 12 are obtained by diffusion into the epitaxial layer 19, and are conductively linked, as described, to contacts 12 and 14 located on the lower surface of the wafer. The collector contact is obtained by a substantially hemispherical portion 15 of metallic material, similar to the connecting contact 13 and 14, in ohmic contact with the monocrystalline body 20, having $N^+$ conductivity, contacting the thin monocrystalline layer 19 which is the collector of the transistor.

A transistor as the one shown may be easily bonded by known means, to three conductors 16, 17, 18 being part, for example, of a network deposited on an insulating board, containing passive elements (such as capacitors, inductors and resistors), and connecting strips.

After bonding the connecting contacts 13, 14 and 15 to corresponding conductors 18, 17, 16, the efficiency of each bond may be checked by a pair of thin test electrodes, as indicated by the dashed lines in FIG. 2, connected to a suitable test circuit, not shown, and put in contact, respectively, for example, with the upper $P^+$-type region, electrically connected with contact 12, and corresponding conductor 16.

The described arrangements may be advantageously used either for fabricating single transistors encapsulated in their individual containers, or more conveniently, as indicated in the example, for transistors to be used in hybrid circuits.

The advantages of having connecting contacts of relatively large dimensions, not occupying a substantial portion of the active available surface, and providing the ability of testing the efficiency of the bonded connections, are self-evident.

Figure 3:
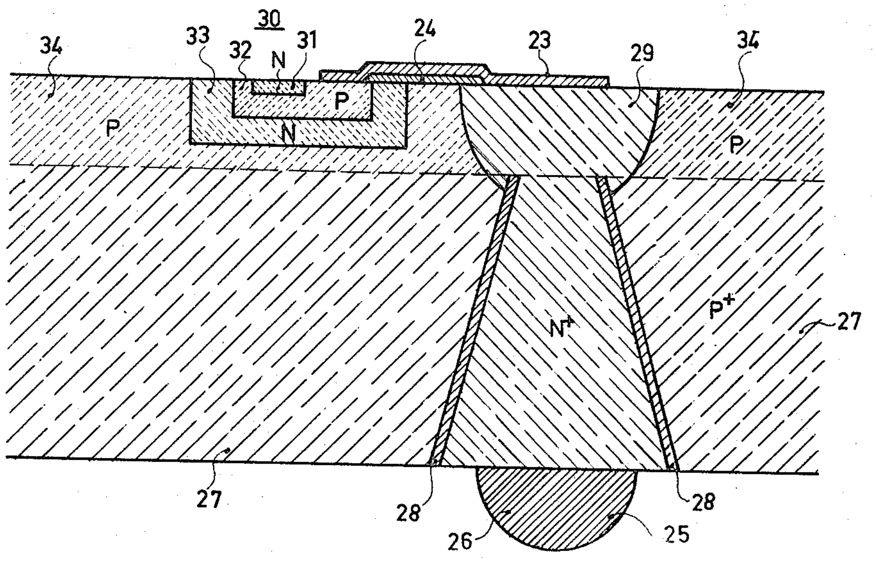
FIG. 3 shows the section of a portion of a semiconductor wafer in the case of integrated circuits.
Figure 9:
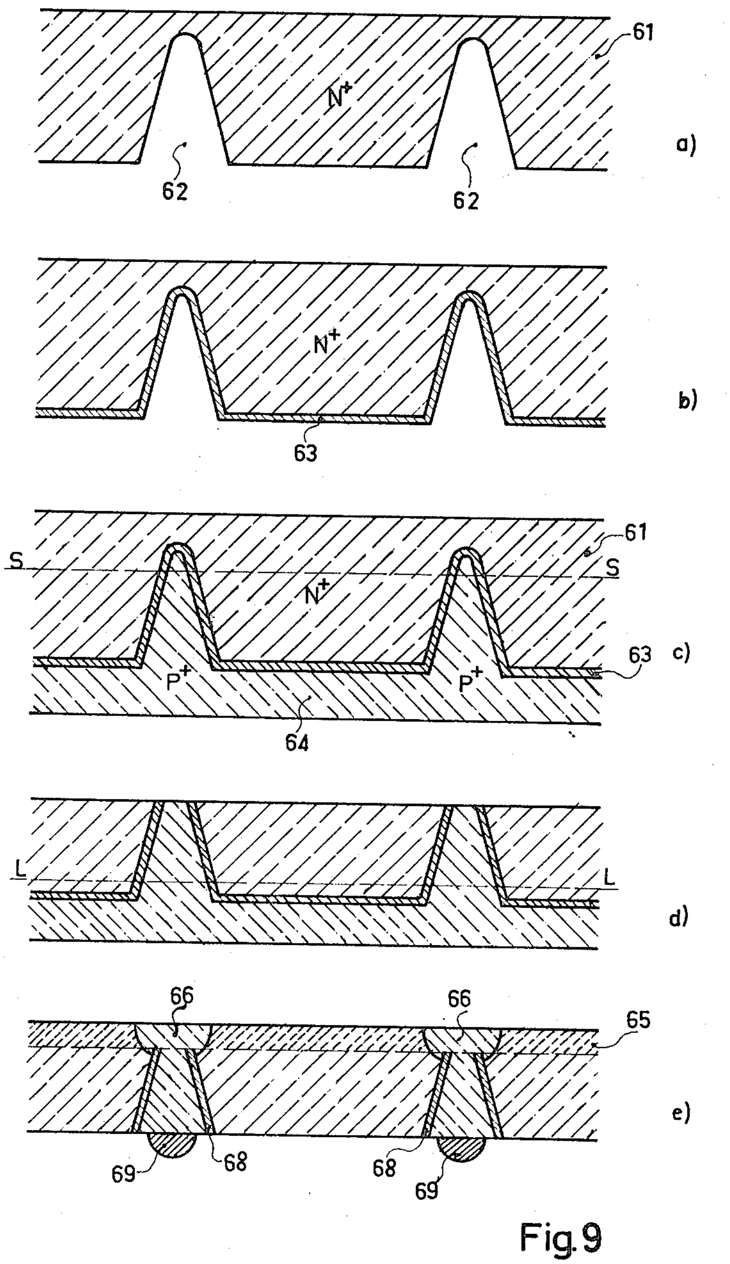
FIG. 9 shows different successive steps in a possible process for putting the invention into effect.

FIG. 3 shows a disposition which can be conveniently used in the case when a plurality of circuit elements like diodes, transistors, capacitors, etc. are fabricated on a single monocrystalline wafer, and the insulation of these elements from one another is required. This is obtained usually by reversely biasing the junctions which completely surround each element. As shown, by way of example, in FIG. 3, a transistor 30 comprises an emitter 31 of type N, contained in a base region 32 of type P, which in turn is contained in a collector region of type N. The collector region 33 is finally completely contained in an epitaxial layer 34 of type P which also contains all remaining transistors and circuit elements fabricated on the upper surface of the wafer. The P-N junction between collector 33 and external layer 34, and the similar junction existing between layer 34 and the most external regions of the other circuit elements, are inversely biased to ensure their insulation from one another. The layer 34, of P-type conductivity, forms an ohmic contact with the underlying monocrystalline body of relatively high conductivity $P^+$. To connect the collector, base and emitter of transistor 30 to the connecting contacts located on the lower surface, as the one indicated by 26, a suitable number of tapered regions like the one indicated by 25, of relatively high $N^+$ type conductivity, is provided. These regions are insulated from the body 26 by a thin dielectric layer 28, composed, for example, of silicon dioxide. The connecting contact 28 is bonded to the lower base of that region, and the upper base is in contact with diffused $N^+$ type region 29 which extends to the upper surface of the epitaxial layer 34. The same is in contact with the metallic conductor 23, which connects it, for example, to the base 32 of transistor 30, and is insulated from the layer 34 by the dielectric layer 24. Negative bias of the body 27, while providing the insulation of the collector region of transistor 30, ensures also the insulation of region 29.

It is thus possible to fabricate medium and large scale integrated circuits provided with a suitable number of low resistance paths to connection contacts located on the lower surface of the wafer.

In the case of hybrid integrated circuits, in which each complete circuit unit, contained in a single package, is formed by a number of interconnected integrated circuit sub-units, their interconnection is set up in the most economic and reliable manner by means of these lower surface contacts.

FIGS. 4, 5 and 6 illustrate examples of different types of interconnection and of spatial relations between circuit sub-units.

As indicated in FIG. 4, two or more sub-units 38 and 39 may be set up side by side on a common insulating board 35 on which suitable conductors 36 provide the connections between the contacts 37 located on the lower surface of the wafers.

FIG. 5 shows two sub-units arranged in back-to-back relation, so that the lower surfaces of both wafers are directly facing one another. The connection contacts 43 and 44 may be directly connected together if this is permitted by their respective position, or, preferably, they may be bonded to conductors 44 located on both faces of an insulating board 45.

Lastly, FIG. 6 shows how two or more sub-units may be superimposed by providing metallic "lands" 49 on the upper surface of the lower sub-units, these "lands" being connected to the contacts 50 on the lower surface of the upper sub-units.

The disposition of FIG. 5 and FIG. 6 may be used to reach a remarkable packaging density, and may be particularly suitable when the integrated circuits are characterized by reduced heat production, as for example, in circuits using metal-oxide-semiconductor field effect transistor, commonly called MOS-FET or similar types.

Figure 7:
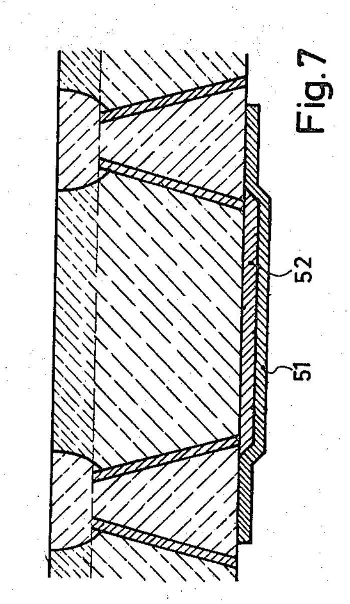
FIG. 7 shows a special use of the invention for connecting two points of an integrated circuit.
Figure 8:
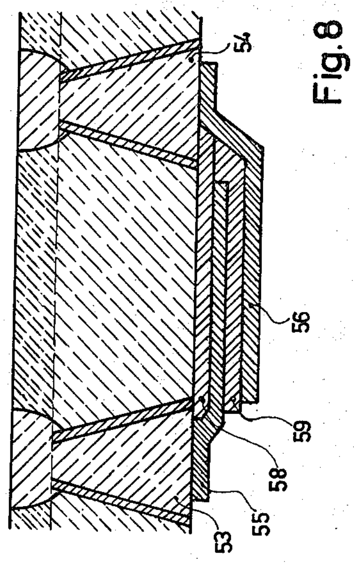
FIG. 8 shows another use of the invention for forming a capacitor between two points of an integrated circuit.

In large or middle scale integrated circuits, some of the major bases of the tapered regions appearing at the lower surface of the wafer may be connected together by conducting strips 51, as shown by FIG. 7, deposited on the lower surface of the body and insulated therefrom by a dielectric layer 52, for example of $SiO_2$ (52). Different points of circuit elements of the upper surface may be connected together by lower surface connections, thus substantially reducing the number of cross-overs between conducting elements on the upper surface. Moreover, as shown by FIG. 8, two tapered regions 53 and 54 may have their major bases connected to two facing conducting surfaces 55 and 56 insulated from one another and from the body by dielectric layers 58, thus forming a capacitor.

With reference to the case illustrated in FIG. 1 and 2 whereby the monocrystalline thick layer is of type $N^+$ and the tapered regions are of type $P^+$ we describe hereinafter a process for providing a monocrystalline wafer having means for electrical connection between upper and lower surfaces according to the invention.

Starting with a monocrystalline silicon wafer 61 of $N^+$-type conductivity and of suitable thickness, its lower surface is etched at predetermined points by known etching means to obtain substantially conical holes 62 having a depth larger than the planned final thickness of the wafer, but smaller than its actual thickness. To obtain this effect, use can be made of known etching means which show a selective etching action in respect to the crystallographic axes of the wafer, in order to enhance the etching depth in the direction of the wafer thickness in comparison to the directions parallel to the major surfaces.

The semiconductor material is thereafter covered by a dielectric layer of $SiO_2$ extended over the whole lower surface and on the interior surface of the holes. This layer can be obtained either by oxidizing the support or by deposition, both such means being well known in the art (FIG. *9b*). On the said lower surface, and into the holes, suitably doped silicon is deposited, thus filling the holes 62 with polycrystalline material of high type $P^+$ conductivity (FIG. *9c*).

Subsequently, the upper surface of the wafer is lapped away down to the level indicated by line S—S in FIG. *9c*, until the apexes of the conical holes are cut out, and on the lapped surface a layer 65 of semiconductor material of type N reduced conductivity is epitaxially grown. On this layer, and in correspondence to the apexes of the tapered regions, a suitable quantity of P-type impurity is diffused, to obtain regions 66 having type $P^+$ conductivity, contacting the upper bases of the regions 68.

Finally, the material under the line LL is lapped away and the connection contacts 69 are deposited on the lower bases of regions 68.

By a similar method such connection means also may be obtained in the case of FIG. 3, as well as in the case of transistors of PNP type. The modifications of the method are due only to the different type of doping and the opposite type of conductivity of the regions.

Other methods comprising a different succession of operations may be used to reach the same result, in place of the method described by way of example.

The described arrangements may be used in the case of transistors and integrated circuits of the type known as "planar epitaxial", now almost generally used, which is characterized by growing a monocrystalline layer of reduced conducibility, into which the different regions forming the circuit elements are obtained by diffusion, on a surface of a monocrystalline wafer.

In the case, now less in use, whereby the said regions are obtained by diffusing the impurities directly into the monocrystalline wafer, suitable modifications of the method and arrangements may be adopted.

In this case the high conductivity tapered regions are insulated from the body by a dielectric layer extending through the whole thickness of the wafer.

What is claimed is:

1. A method of forming at least one conductive member through a monocrystalline semiconductor wafer having a specific type of conductivity and having first and second opposite surfaces, said method comprising the steps of:

forming at least one hole in the first surface of the monocrystalline semiconductor;

coating the interior surface of the resultingly formed hole with a thin layer of electrically nonconductive material;

filling the coated hole with a polycrystalline material having a type of conductivity which is opposite the specific type of conductivity of the monocrystalline semiconductor wafer;

lapping the second surface so as to expose the polycrystalline material in the filled hole;

epitaxially growing a layer of semiconductor material on the lapped surface, the resulting epitaxially grown layer having the same type of conductivity as the specific type of conductivity of the monocrystalline semiconductor wafer;

locating the portion of the epitaxially grown layer which contacts the polycrystalline filled hole; and diffusing a suitable quantity of impurity, having the same type of conductivity as the conductivity of the polycrystalline material, into only those portions of the epitaxially grown layer which contact a polycrystalline filled hole said diffusion substantially ending at the monocrystalline semiconductor wafer so as to obtain a conductive member through the epitaxially grown layer and the monocrystalline semiconductor wafer which is insulated only from the monocrystalline semiconductor wafer.

2. The method of claim 1, wherein said step of forming at least one hole comprises the step of:

etching at least one area of the first surface of the monocrystalline semiconductor wafer so as to form at least one hole; and limiting said etching step to an etching depth less than the total thickness of the monocrystalline semiconductor wafer.

3. The method of claim 2 wherein said etching step comprises:

selectively etching the monocrystalline semiconductor wafer in order to enhance the etching depth in the direction of the wafer thickness in comparison to the directions parallel to the first surface from which said etching step is initiated so as to form a conical shaped hole.

* * * * *